United States Patent
Ranucci et al.

(10) Patent No.: US 7,554,152 B1
(45) Date of Patent: Jun. 30, 2009

(54) VERSATILE SYSTEM FOR INTEGRATED SENSE TRANSISTOR

(75) Inventors: Paul Ranucci, Tucson, AZ (US); Robert Labicane, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 361 days.

(21) Appl. No.: 11/330,049

(22) Filed: Jan. 11, 2006

(51) Int. Cl.
*H01L 29/788* (2006.01)

(52) U.S. Cl. .................. 257/316; 257/288; 438/257

(58) Field of Classification Search .............. 257/341, 257/365, 401; 327/541, 581
See application file for complete search history.

(56) References Cited

U.S. PATENT DOCUMENTS

| | | | |
|---|---|---|---|
| 4,021,701 A | 5/1977 | Davies | |
| 4,533,845 A | 8/1985 | Bynum et al. | |
| 5,272,392 A | 12/1993 | Wong et al. | |
| 5,408,141 A * | 4/1995 | Devore et al. | 327/541 |
| 5,867,015 A | 2/1999 | Corsi et al. | |
| 6,600,362 B1 | 7/2003 | Gavrila | |
| 6,819,095 B1 | 11/2004 | Dubhashi et al. | |

OTHER PUBLICATIONS

S. Yuvarajan et al., Performance Analysis and Signal Processing in a Current Sensing Power MOSFET (SENSEFET), 1991 IEEE, pp. 1445-1450.
Ph. Givelin et al., "Application of a CMOS Current Mode Approach to On-Chip Current Sensing in Smart Power Circuits", IEE Proce.- Circuits Devices Syst., vol. 142, No. 6, Dec. 1995, pp. 357-363.
On Semiconductor, "AND8093/D, Current Sensing Power MOSFETs", Semiconductor Components Industries, LLC, Jul. 2002, pp. 1-12.
S. Clemente et al., "An Introduction to the HEXSense Current-Sensing Device", International Rectifier Power MOSFET Application Notes, 1986, pp. 1-6.

* cited by examiner

*Primary Examiner*—N Drew Richards
*Assistant Examiner*—Mamadou Diallo

(57) ABSTRACT

The present invention provides a versatile system for producing sense transistors having optimized thermal and parametric matching with an associated power transistor. A power transistor is formed, having a plurality of alternating source and drain structures, with a plurality of gate structures interposed there between. At a desired location within the power transistor—which may be in a central location, or symmetrically distributed—one or more sense transistors are formed from an isolated portion of either a drain or source structure.

20 Claims, 3 Drawing Sheets

VERSATILE SYSTEM FOR INTEGRATED SENSE TRANSISTOR

TECHNICAL FIELD OF THE INVENTION

The present invention relates generally to semiconductor circuitry and, more particularly, to a system for providing highly accurate sense transistor circuitry.

BACKGROUND OF THE INVENTION

In a number of modern electronics systems, various transistor structures are designed to operate at, and withstand, different voltage and current levels. For example, numerous designs commonly utilize high-voltage "power" transistors in conjunction with low-voltage transistors. Generally, most designs seek to minimize the number of "power" transistors—as such components are relatively expensive and cumbersome, when compared to their low-voltage counterparts. To this end, and in order to successfully interface higher voltage transistors to their low-voltage counterparts, many designs pair high power transistor structures with some configuration of lower power sensing transistors.

Commonly, sensing transistors are configured in a manner that divides or scales down voltage or current levels across the high power transistor, such that those levels can be measured and processed with low-power, cost-efficient transistors. A voltage or current parameter across one low-power sensing transistor may then be measured or processed, as representative of a pre-determined fraction of that same parameter across the power transistor.

In the past, the level of accuracy with which such sensing approximations were made was—in some cases—marginal. At the time, however, system using such approaches may not have needed highly accurate sensing. As the demands on signal communications and processing systems have steadily increased, though, the need for greater accuracy and precision in sensing transistor arrangements has also increased.

Most conventional sensing transistor arrangements commonly involve a power transistor fabricated on the same die as one or more sensing transistors. For example, a CMOS power FET may have one or more sense FETs fabricated on the same die. In some instances, a sense FET may be physically located some distance on the die from the power FET, or it may be located directly about the perimeter thereof.

Conventionally, addressing the accuracy of sense FETs concerns matching—as closely as possible—the fabrication characteristics of a sense FET to a power FET. Even where a sense FET is fabricated around the immediate perimeter of a power FET, only a limited level of matching or accuracy can be attained. Fabrication and processing variations between the transistor structures in the center of a large power FET and a sense FET around the outer perimeter of the power FET commonly result in some nominal degree of mismatch—thereby limiting the achievable accuracy level of conventional sense FET designs. Thermal variations between the area of the sense FET and the area of the power FET can also further contribute to mismatch.

In addition to the physical considerations, there are also now a number of parametric considerations that may impact the usefulness of conventional sense transistor configurations. For example, there are a number of advanced power transistor designs that—to a certain extent—render such conventional sense transistor topologies inefficient or infeasible. These power transistor designs may be optimized for operational parameters—such as extremely low on resistance ($R_{on}$)—that make conventional divide or scale down sensing impractical.

As a result, there is a need for a system that provides highly accurate sense transistor circuitry—one that optimizes matching of sense and power transistor structures, and minimizes or obviates thermal and fabrication variations—in a versatile, cost-effective, commercially-viable manner.

SUMMARY OF THE INVENTION

The present invention provides a versatile system, comprising various constructs and methods, for providing a sense transistor structure—particularly a sense FET—optimally matched with an associated power transistor. The system of the present invention integrates one or more sense transistor structures within the architecture of a power transistor. The sense transistor architecture of the present invention shares architectural and parametric characteristics with the power transistor—optimizing lithographic matching and thermal coupling, and obviating the need for divide-down architectures. The system of the present invention thus compensates for, and overcomes, fabrication or processing variations across a given area—and is easily implemented within a number of commercially viable semiconductor layout and process technologies.

Specifically, the present invention provides an architecture that produces sense transistors having optimized thermal and parametric matching with an associated power transistor. A power transistor is formed, having a plurality of alternating source and drain structures, with a plurality of gate structures interposed there between. At a desired location within the power transistor—which may be in a central location, or symmetrically distributed—one or more sense transistors are formed from an isolated portion of either a drain or source structure. The sense transistor structure may then be utilized in conjunction with a variety of current or voltage measurement circuitry.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

Figure 1A:
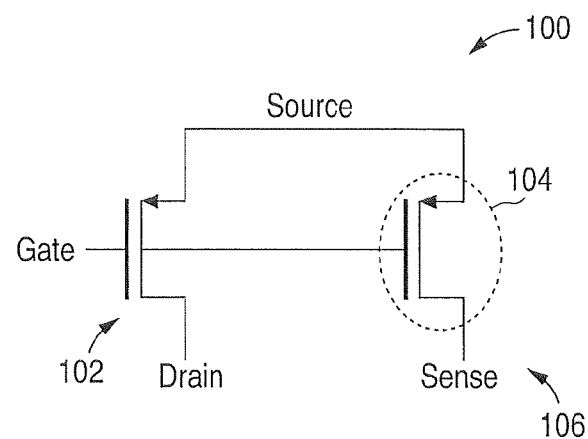
FIGS. 1a, 1b, and 1c provide illustrations depicting one embodiment of a transistor architecture illustrating certain aspects of the present invention.

While the making and using of various embodiments of the present invention are discussed in detail below, it should be appreciated that the present invention provides many applicable inventive concepts, which can be embodied in a wide variety of specific contexts. The present invention is hereafter illustratively described in conjunction with the design and operation of sense transistor structures—particularly sense FETs (field effect transistors)—utilized in conjunction with certain power transistors—particularly power FETs. Although described in relation to such constructs and applications, the teachings and embodiments of the present invention may be beneficially implemented with a variety of semiconductor devices and technologies. The specific embodiments discussed herein are, therefore, merely demonstrative of specific ways to make and use the invention and do not limit the scope of the invention.

The present invention provides a versatile system, comprising various constructs and methods, for providing a sense transistor structure—particularly a sense FET—optimally matched with an associated power transistor. The system of the present invention compensates for, and overcomes, fabrication or processing variations across a given area—and is easily implemented within a number of commercially viable semiconductor layout and process technologies.

As previously discussed, conventional power FET architectures generally do not have sense elements fully integrated within—or distributed throughout—the power FET itself. These topologies thus commonly have some degree of inaccuracy in their matching of gate, source and drain voltages. They tend to be impacted by some degree of lithographic variability—as well as variations in thermal sensitivity, depending on relative location. Overall, these factors result in non-optimal sensing or measurement accuracy with such devices. Furthermore, a number of conventional layouts do not include points for Kelvin voltage sensing, or built-in blanking—meaning that their sense measurements are less accurate for high currents and external blanking circuitry must be constructed.

In contrast, the system of the present invention integrates one or more sense transistor structures within the architecture of a power transistor. The sense transistor architecture of the present invention shares architectural, lithographic and parametric characteristics with the power transistor—optimizing lithographic matching and thermal coupling. The system of the present invention also efficiently provides Kelvin sensing of local voltages within a power FET, as well as automatic blanking of sense signals when that FET turns off. The system of the present invention may be efficiently implemented within a number of commercial fabrication processes—with some embodiments that may be implemented with a single metal layer. Furthermore, certain embodiments of the present invention may obviate the need for shielding sense structures.

The system of the present invention is also highly versatile and readily adaptable to a number advanced power FET designs. Consider, for example, a power FET design optimized for an extremely low on resistance ($R_{on}$).

Using a parallel sense FET to replicate a power FET current—usually on a largely scaled down basis—is a common approach for integrated power FETs. For low $R_{on}$ power FETs, however, operational drain to source voltage can be quite small—which increases the need for reliable matching between a power FET and a sense FET, in order to get an accurate representation of the power FET current.

Detecting current flow through a low $R_{on}$ power FET using conventional methods can be difficult—because such methods can consume power, or are fairly inaccurate due to the small signals involved. Depending upon the specific performance levels of a given design, common parametric considerations—such as signal-to-noise ratio (SNR)—can render conventional approaches infeasible.

In contrast, the system of the present invention incorporates one or more sense FETs into a power FET structure. It provides a cross-coupled, distributed structure—which optimizes temperature and lithographic matching between the power FET and the sense FET. In addition, embodiments of the present invention may use gate voltage of a power FET to control a sense FET—rendering the sense element high impedance when the power FET is off. This is very convenient for switched power FETs—providing a blanking of the sense signal when the power FET is off.

Figure 1B:
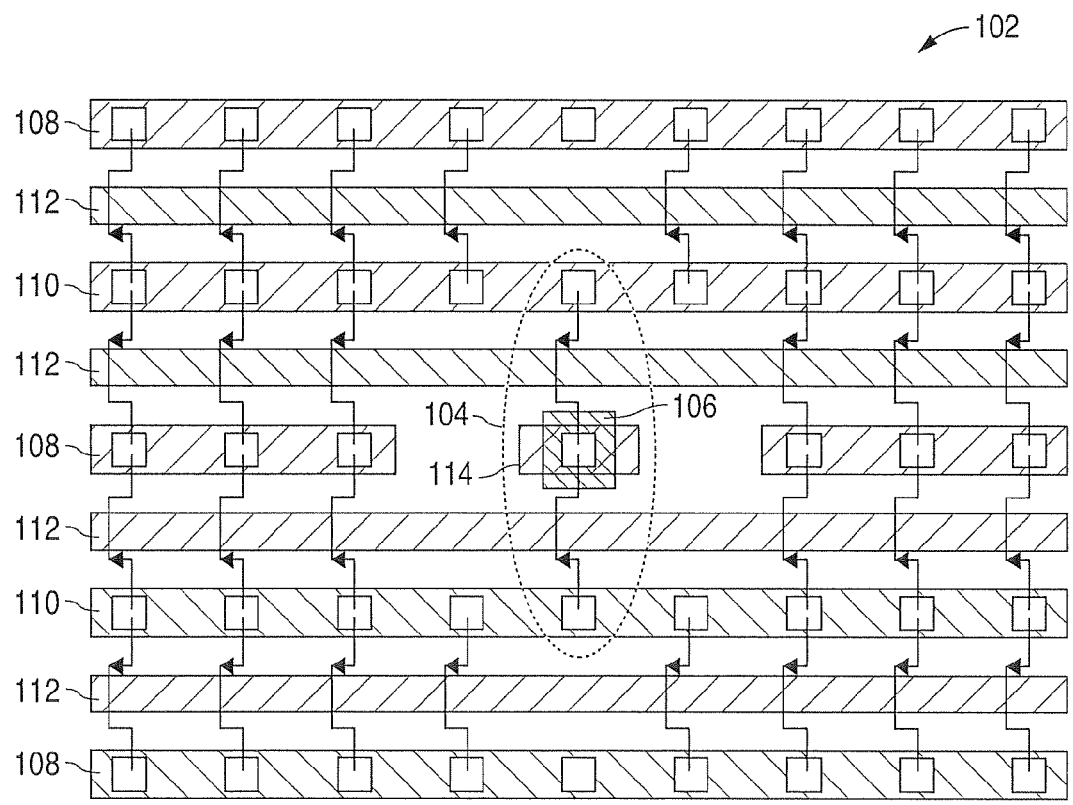

Certain aspects of the present invention are described now in greater detail, beginning with reference to one embodiment of a transistor architecture 100 as depicted in FIGS. 1a and 1b. FIG. 1a depicts a power FET 102 having an integrated sense FET 104 (not to scale)—effectively adding an additional "sense" terminal 106 to the drain, gate and source terminals of FET 102. In this embodiment, FET 104 is source coupled with FET 102. Although depicted in this embodiment as PFETS, other embodiments may provide such structures as, for example, NFETs.

FIG. 1b depicts one embodiment of a layout of FET 102. In this embodiment, FET 102 is laid out as alternating source 108 and drain 110 structures, having gate structures 112 interposed there between. In a selected location in transistor 102—in this embodiment, in the center—some small portion 114 of a source structure 108 may be isolated to form, with the adjacent gate and drain structures, sense transistor 104. In alternative embodiments, a portion of the drain structure may be isolated in such a manner as well.

Figure 1C:
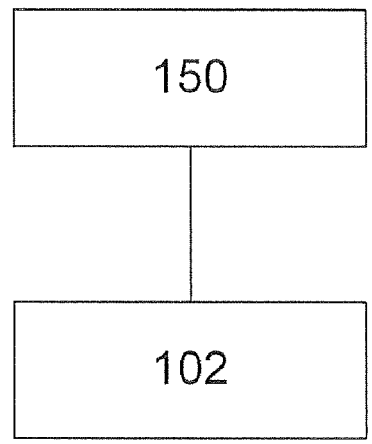

Sense structure 104 has the same gate voltage, local bulk potential and either source or drain voltage as the entire power FET 102. Structure 104 may be routed to or coupled independent of FET 102, providing terminal 106 that may be connected to some circuitry (e.g., sense or measurement) external to FET 102. FIG. 1c is an illustration of FET 102 connected to external circuitry 150.

Figure 2:
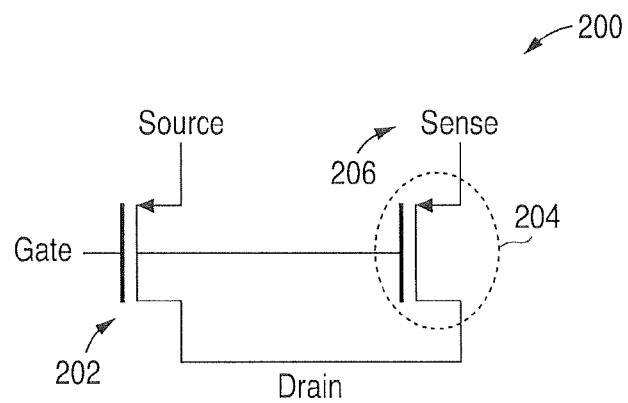
FIG. 2 provides an illustration depicting another embodiment of a transistor architecture illustrating certain aspects of the present invention.

Referring now to FIG. 2, one alternative embodiment of a transistor architecture 200 is depicted. Architecture 200 provides an alternative configuration of architecture 100—as depicted in FIG. 1a. FIG. 2 depicts a power FET 202 having an integrated sense FET 204 (not to scale)—effectively adding additional "sense" terminal 206. In this embodiment, FET 204 is drain coupled with FET 202. Again, although depicted in this embodiment as PFETs, other embodiments may provide such structures as, for example, NFETs.

Operationally, there are a number of applications in which the architecture of the present invention may be utilized advantageously. A sense element of the present invention may be used as a switch connection, to sense voltage at a particular point in the power MOSFET—in a Kelvin sensing configuration, for example. In the embodiment depicted in FIG. 1b, for example, sense element 104 is instantiated in a central location within transistor 102. Terminal 106 may be connected to a high impedance node that draws little current to provide Kelvin sensing of voltage at that location within FET 102.

Alternatively, terminal 106 may be connected to a low impedance node—forcing a voltage across element 104, such that its current may either be measured or used in a circuit. Further, connecting the gate of element 104 to the gate of FET 102 may provide blanking of signal from element 104 whenever FET 102 is off. When FET 102 turns off or transitions to a high-impedance state, element 104 acts in a similar manner—proving useful in circuits where power FET 102 is switched.

Depending upon specific design and performance criteria of a given power transistor, a number of embodiments of the present invention may be provided. In such embodiments, multiple sense elements may be strategically placed throughout a power transistor's structure, in order to—for example—achieve an appropriate gain ratio for the sense element, or obviate thermal and fabrication variations. For example, a number of sense elements may be instantiated throughout a power transistor in a symmetric fashion.

Figure 3:
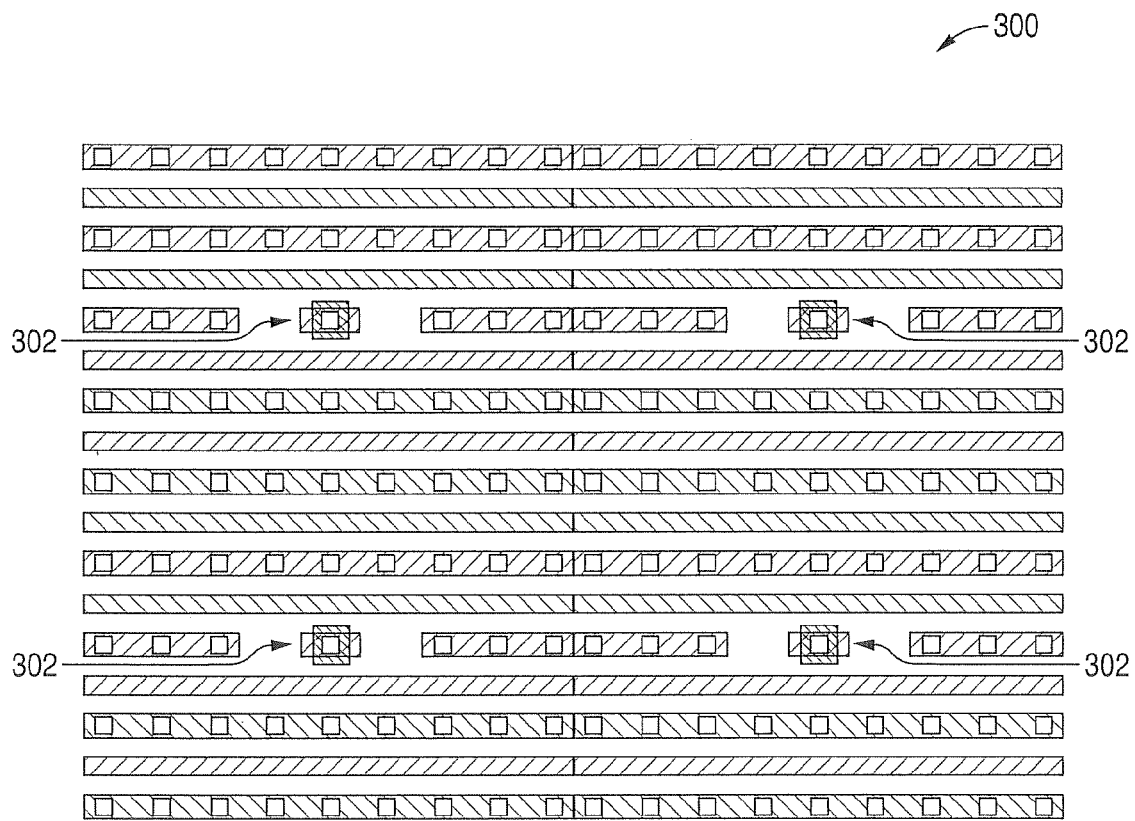
FIG. 3 provides an illustration depicting one embodiment of a transistor structure according to certain aspects of the present invention.

One embodiment of such a configuration is illustrated now with reference to transistor structure 300, as depicted in FIG. 3. Transistor 300 is a power FET of the type depicted in FIG. 1b. A plurality of sense elements 302 are instantiated in a symmetric fashion throughout transistor 300.

Operationally, a configuration of the type illustrated in FIG. 3—where a distributed network of sense elements 302 is gate/source connected to a power FET 300—may be used in a Kelvin sensing of the drain of FET 300. A Kelvin sense may be utilized in conjunction with an amplifier to force the drain of the sense elements to be equivalent to the drain of the main FET, and produce a current through the sense elements representative of the total FET current. Such an embodiment may be used in a variety of configurations for sensing voltages throughout a power FET, as well as sensing current.

Thus, the present invention provides a system for optimal matching sense transistor architecture. Various embodiments provide one or more sense transistor elements in central or symmetrically distributed instances throughout a power transistor. In such a manner, any effects of thermal or fabrication variation are minimized or obviated. Various embodiments of the present invention may be readily provided for a variety of current or voltage measurement or sensing applications.

As should be apparent to those of skill in the art, the system of the present invention may be applied in a wide variety of transistor architectures. For example, the present invention may be used to advantage in any semiconductor transistor having a layout topology similar to those illustrated herein. The present invention may be implemented to advantage for PFET and NFET architectures. In all embodiments of the present invention, the constituent constructs, operations, functions or components may be implemented in a wide variety of ways—comprising various suitable circuitry and semiconductor structures. Operational voltage or current levels may be tailored to suit the needs of a particular application. Thus all such variations, and all other similar variations and combinations, are comprehended by the present invention. All such embodiments may be employed to provide the benefits of the present invention.

The embodiments and examples set forth herein are therefore presented to best explain the present invention and enable those skilled in the art to make and utilize the invention. However, those skilled in the art will recognize that the foregoing description and examples have been presented for the purpose of illustration and example only. The teachings and principles of the present invention are applicable to a number of semiconductor device applications. The description as set forth herein is therefore not intended to be exhaustive or to limit the invention to the precise form disclosed. As stated throughout, many modifications and variations are possible in light of the above teaching without departing from the spirit and scope of the following claims.

What is claimed is:

1. A method of producing a sense transistor operatively associated with a power transistor, the method comprising the steps of:
   providing a power transistor, having a plurality of alternating source and drain structures, with a plurality of gate structures interposed there between;
   at a desired location, forming a sense transistor by providing an isolated portion of either a drain or source structure, wherein the sense transistor has a same local bulk potential as the power transistor; and
   coupling some circuitry, external to the power transistor, to the isolated portion.

2. The method of claim 1, wherein the step of providing a power transistor further comprises providing a power MOSFET.

3. The method of claim 2, wherein the step of providing a power transistor further comprises providing a power PFET.

4. The method of claim 2, wherein the step of providing a power transistor further comprises providing a power NFET.

5. The method of claim 1, wherein the step of forming a sense transistor further comprises providing an isolated portion of a drain structure.

6. The method of claim 1, wherein the step of forming a sense transistor further comprises providing an isolated portion of a source structure.

7. The method of claim 1, wherein the step of forming a sense transistor further comprises forming a sense transistor in a central location within the power transistor.

8. The method of claim 1, wherein the step of forming a sense transistor further comprises forming a plurality of sense transistors in locations symmetrically distributed throughout the power transistor.

9. The method of claim 1, wherein the step of coupling some circuitry further comprises coupling some current measuring circuitry.

10. The method of claim 1, wherein the step of coupling some circuitry further comprises coupling some voltage measuring circuitry.

11. A power and sense transistor structure comprising:
    a power transistor, having a plurality of alternating source and drain structures, with a plurality of gate structures interposed there between;
    a sense transistor having an isolated portion of either a drain or source structure at a desired location within the power transistor, wherein the sense transistor has a same local bulk potential as the power transistor; and
    circuitry, external to the power transistor, coupled to the sense transistor.

12. The structure of claim 11, wherein the power transistor a PFET.

13. The structure of claim 11, wherein the power transistor comprises an NFET.

14. The structure of claim 11, wherein the sense transistor is formed by isolating a portion of a drain structure.

15. The structure of claim 11, wherein the sense transistor is formed by isolating a portion of a source structure.

16. The structure of claim 11, wherein the desired location is a central location within the power transistor.

17. The structure of claim 11, further comprising a plurality of sense transistors formed in locations symmetrically distributed throughout the power transistor.

18. The structure of claim 11, wherein the circuitry comprises current measuring circuitry.

19. The structure of claim 11, wherein the circuitry comprises voltage measuring circuitry.

20. A method of optimizing thermal or parametric matching between a power transistor and an operatively associated sense transistor, the method comprising the steps of:

forming a power transistor, having a plurality of alternating source and drain structures, with a plurality of gate structures interposed there between; and at a desired location within the power transistor, forming a sense transistor from an isolated portion of either a drain or source structure, wherein the sense transistor has a same bulk potential as the power transistor.

\* \* \* \* \*